United States Patent [19]
Figura et al.

[11] Patent Number: 5,661,064
[45] Date of Patent: Aug. 26, 1997

[54] METHOD OF FORMING A CAPACITOR HAVING CONTAINER MEMBERS

[75] Inventors: Thomas Figura; Pierre C. Fazan, both of Boise, Id.

[73] Assignee: Micron Technology, Inc., Boise, Id.

[21] Appl. No.: 558,643

[22] Filed: Nov. 13, 1995

[51] Int. Cl.$^6$ .............................................. H01L 21/8242
[52] U.S. Cl. .............................................. 438/396; 438/397
[58] Field of Search ................................ 437/47, 52, 60, 437/919

[56] References Cited

U.S. PATENT DOCUMENTS

| | | | |
|---|---|---|---|
| 4,558,509 | 12/1985 | Tiwari | 29/576 B |
| 4,568,565 | 2/1986 | Gupta et al. | 427/53.1 |
| 5,023,683 | 6/1991 | Yamada | 257/306 |
| 5,053,351 | 10/1991 | Fazan et al. | 437/52 |
| 5,130,172 | 7/1992 | Hicks et al. | 427/252 |
| 5,139,825 | 8/1992 | Gordon et al. | 427/255.2 |
| 5,168,073 | 12/1992 | Gonzalez et al. | 437/52 |
| 5,216,267 | 6/1993 | Jin et al. | 257/306 |
| 5,300,321 | 4/1994 | Nakano et al. | 427/248.1 |
| 5,320,878 | 6/1994 | Maya | 427/573 |
| 5,403,620 | 4/1995 | Kaesz et al. | 427/252 |

OTHER PUBLICATIONS

Conrad J.R. et al., "Ion Bea, Assisted Coating And Surface Modification With Plasma Source Ion Implantation", J. Vac. Sci. Technol., A 8 (4), Jul./Aug. 1990, 3146–3151.

T.Morihara et al., "Disk–Shaped Stacked Capacitor Cell for 256 Mb Dynamic Random–Access Memory", Aug. 19, 1994, Jpn. J. Appl. Phys. vol. 33 (1994), Pt. 1, No. 8, pp. 14–19.

S.Woo et al., "Selective Etching Technology of in–situ P Doped Poly–Si (SEDOP) for High Density DRAM Capacitors", 1994 Symposium on VLSI Technology Digest of Technical Papers, pp. 25–26.

H. Watanabe et al., "Stacked Capacitor Cells for High–density dynamic RAMs", IEDM 1988, pp. 600–603.

*Primary Examiner*—Jey Tsai
*Attorney, Agent, or Firm*—Wells, St. John, Roberts, Gregory & Matkin, P.S.

[57] ABSTRACT

A capacitor construction includes, a) first and second electrically conductive capacitor plates separated by an intervening capacitor dielectric layer, the first capacitor plate comprising first and second container members, the second container member being received inside of the first container member, the first and second container members comprising a respective ring portion and a respective base portion; and b) a pedestal disk positioned elevationally intermediate the first container member base and the second container member base to space and support the second container member relative to the first container member. The structure is preferably produced by using a series of alternating first and second layers of semiconductive material provided over a molding layer within a container contact opening therein. One of the first and second layers has an average conductivity enhancing dopant concentration of greater than about $5 \times 10^{19}$ ions/cm$^3$, with the other of the first and second layers having an average conductivity enhancing dopant concentration from 0 ions/cm$^3$ to about $5 \times 10^{19}$ ions/cm$^3$. At least one of the first and second layers is selectively etchable relative to the other of the first and second layers to facilitate a container construction and formation of the pedestal disk. Utilization of alternate materials to the doped semiconductive material is also contemplated.

29 Claims, 6 Drawing Sheets

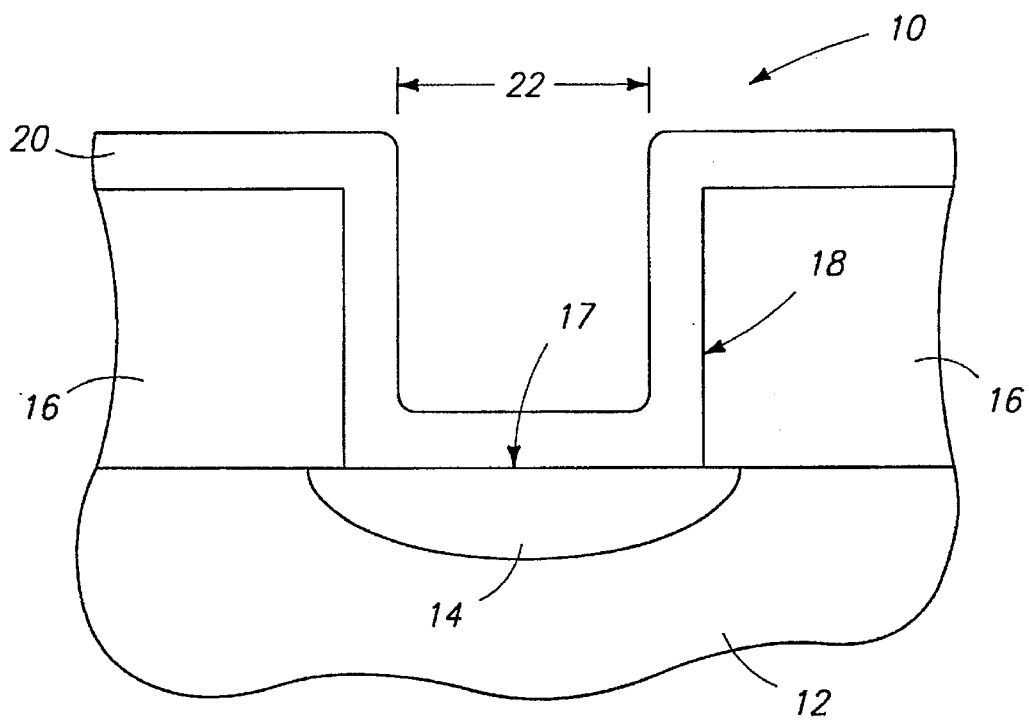
_Fig. 1_
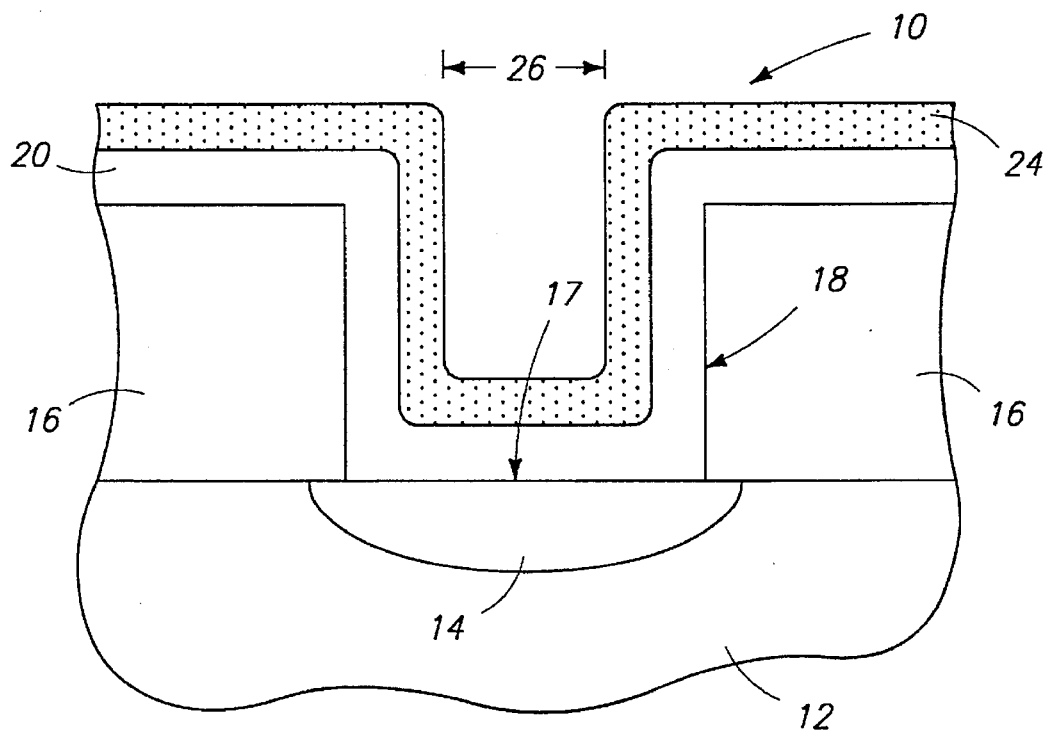
_Fig. 2_

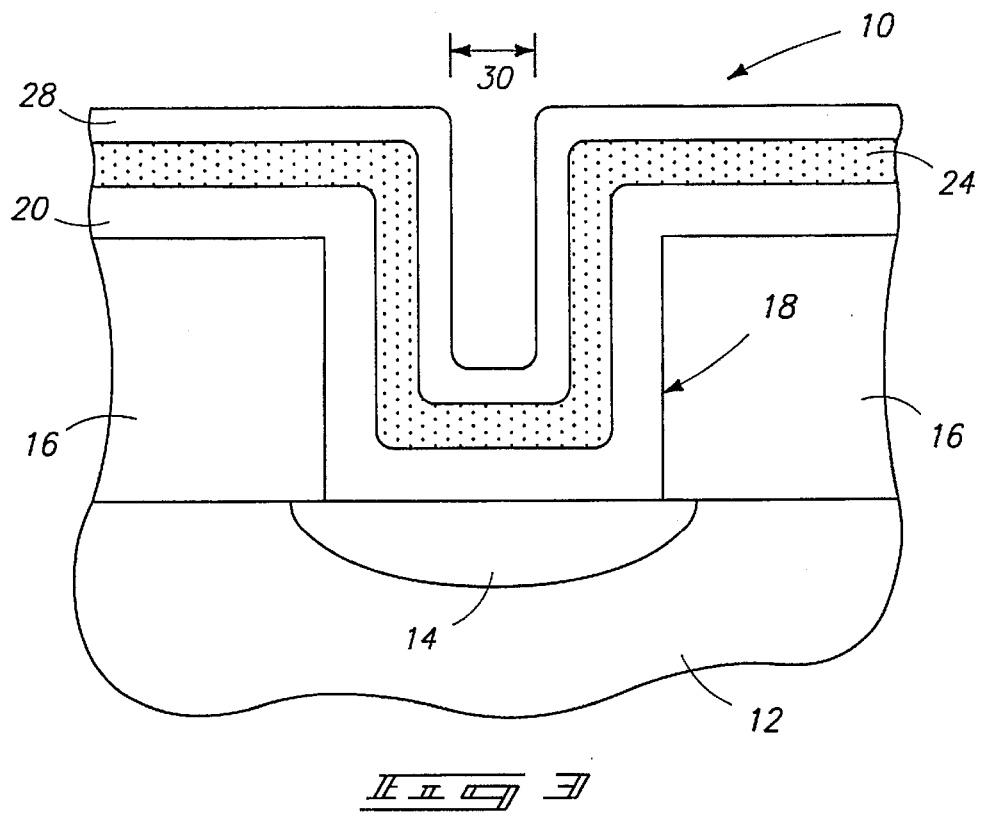
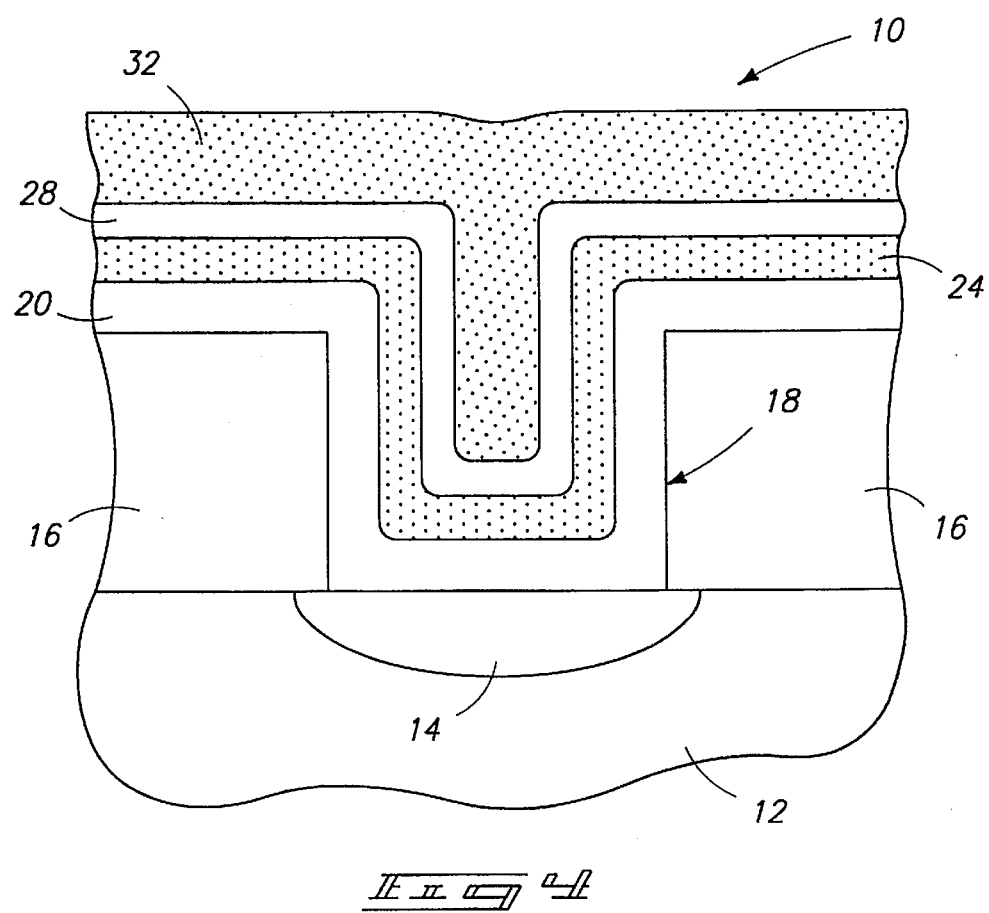

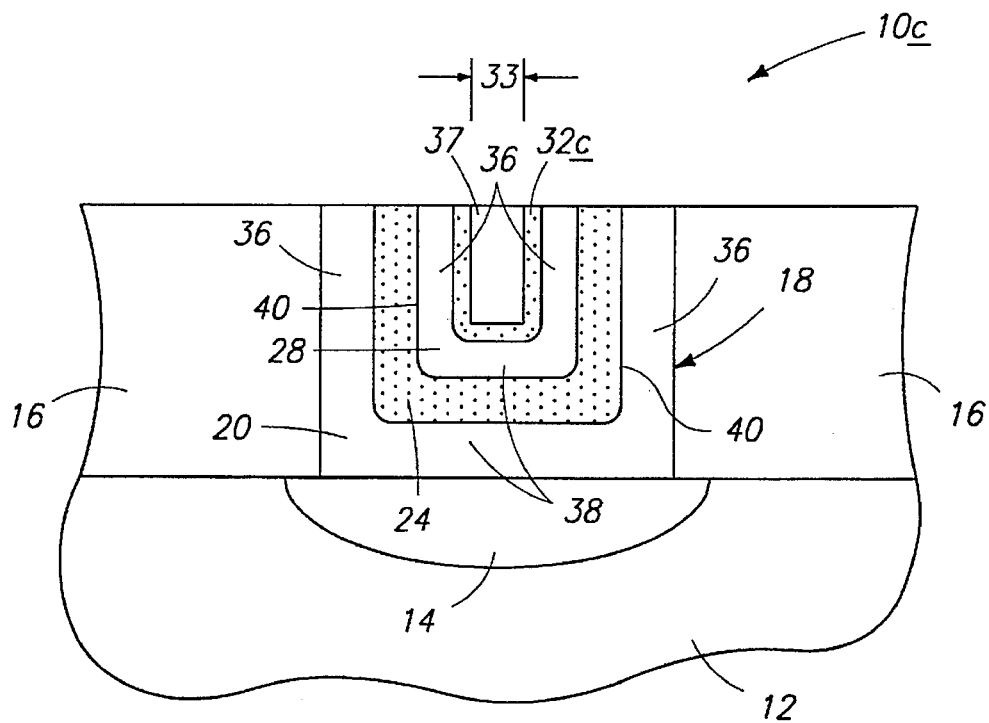
_FIG. 11_
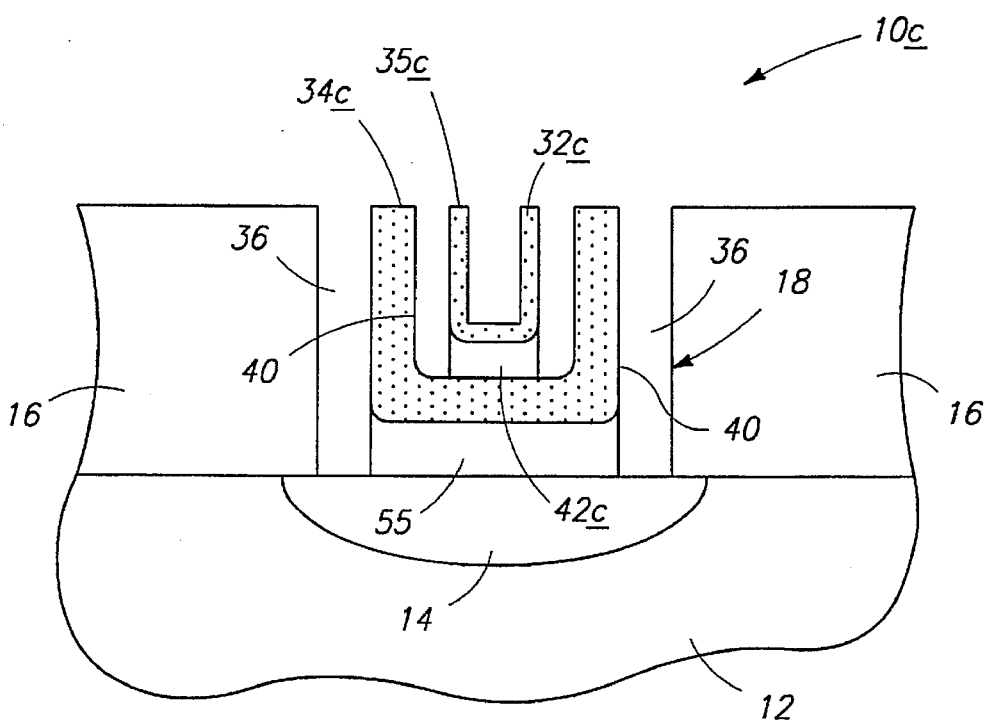
_FIG. 12_

METHOD OF FORMING A CAPACITOR HAVING CONTAINER MEMBERS

TECHNICAL FIELD

This invention relates generally to capacitor formation in semiconductor wafer processing, and to resultant capacitor constructions.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area.

The principal way of increasing cell capacitance is through cell structure techniques. Such techniques include three-dimensional cell capacitors, such as trenched or stacked capacitors. This invention concerns stacked capacitor cell constructions, including what are commonly known as crown or cylindrical container stacked capacitors.

BRIEF DESCRIPTION OF THE DRAWINGS

Preferred embodiments of the invention are described below with reference to the following accompanying drawings.

FIG. 1 is a diagrammatic sectional view of a semiconductor wafer fragment at one processing step in accordance with the invention.

FIG. 2 is a view of the FIG. 1 wafer fragment at a processing step subsequent to that shown by FIG. 1.

FIG. 3 is a view of the FIG. 1 wafer fragment at a processing step subsequent to that shown by FIG. 2.

FIG. 4 is a view of the FIG. 1 wafer fragment at a processing step subsequent to that shown by FIG. 3.

FIG. 11 is a diagrammatic sectional view of another alternate embodiment semiconductor wafer fragment at a processing step in accordance with the invention.

FIG. 12 is a view of the FIG. 11 wafer fragment at a processing step subsequent to that shown by FIG. 11.

DETAILED DESCRIPTION OF THE PREFERRED EMBODIMENTS

Figure 5:
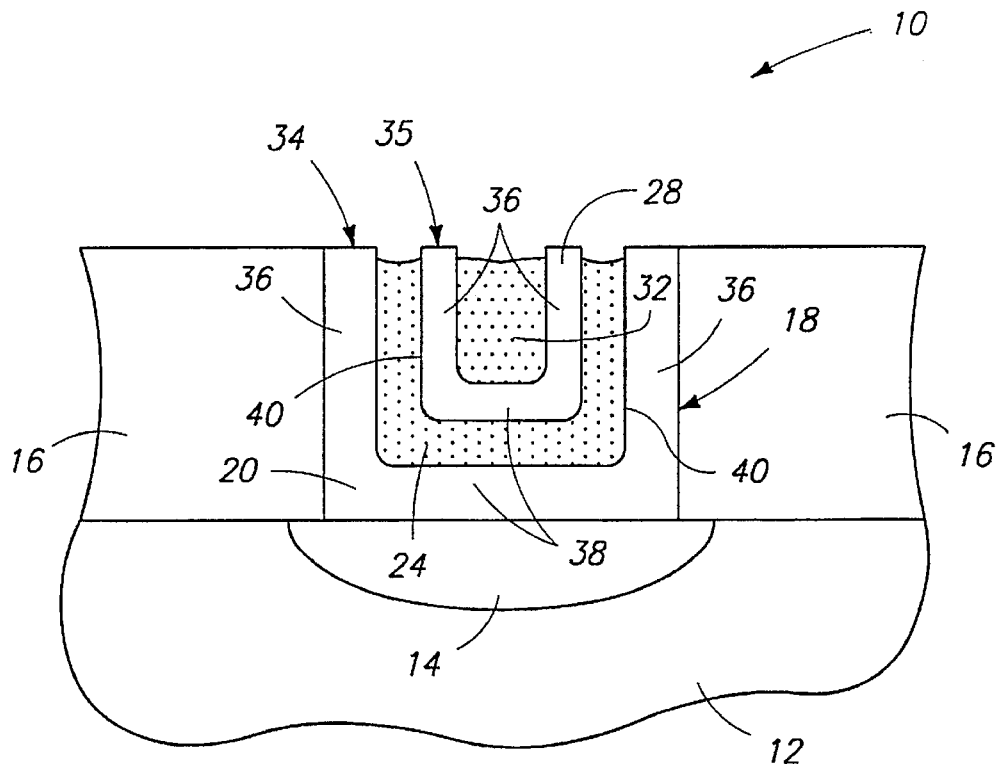
FIG. 5 is a view of the FIG. 1 wafer fragment at a processing step subsequent to that shown by FIG. 4.

This disclosure of the invention is submitted in furtherance of the constitutional purposes of the U.S. Patent Laws "to promote the progress of science and useful arts" (Article 1, Section 8).

In accordance with one aspect of the invention, a method of forming a capacitor comprises the following steps:

providing a node location to which electrical connection to a capacitor storage node is to be made;

providing a capacitor molding layer outwardly of the node location;

providing a container contact opening through the molding layer to the node location;

providing a series of alternating first and second layers of material over the molding layer within the container contact opening, at least one of the first and second layers being selectively etchable relative to the other of the first and second layers;

removing the alternating first and second layers of material from outwardly of the capacitor molding layer to define isolated first and second container members of the other of the first and second layers within the container contact opening;

selectively etching the one of the first and second layers of material from between the first and second container members, the selective etching leaving a pedestal disk of the one of the first and second layers of material elevationally between the first and second container members;

providing a capacitor dielectric layer over the first and second container members; and providing an outer capacitor plate over the capacitor dielectric layer.

In accordance with another aspect of the invention, a method of forming a capacitor comprises the following steps:

providing a node location to which electrical connection to a capacitor storage node is to be made;

providing a capacitor molding layer outwardly of the node location;

providing a container contact opening through the molding layer to the node location;

providing a series of alternating first and second layers of semiconductive material over the molding layer within the container contact opening, one of the first and second layers having an average conductivity enhancing dopant concentration of greater than about $5\times10^{19}$ ions/cm$^3$, the other of the first and second layers having an average conductivity enhancing dopant concentration from 0 ions/cm$^3$ to about $5\times10^{19}$ ions/cm$^3$, at least one of the first and second layers being selectively etchable relative to the other of the first and second layers;

removing the alternating first and second layers of semiconductive material from outwardly of the capacitor molding layer to define isolated first and second container members of the other of the first and second layers within the container contact opening;

selectively etching the one of the first and second layers of semiconductive material from between the first and second container members and from remaining portions of the container contact opening, the selective etching leaving a pedestal disk of the one of the first and second layers of semiconductive material elevationally between the first and second container members;

providing a capacitor dielectric layer over the first and second container members; and providing an outer capacitor plate over the capacitor dielectric layer.

In accordance with still a further aspect of the invention, a capacitor construction comprises:

first and second electrically conductive capacitor plates separated by an intervening capacitor dielectric layer, the first capacitor plate comprising first and second container members, the second container member being received inside of the first container member, the first and second container members comprising a respective ring portion and a respective base portion; and a pedestal disk positioned elevationally intermediate the first container member base and the second container member base to space and support the second container member relative to the first container member.

Referring to FIG. 1, a semiconductor wafer fragment in process is indicated generally with reference numeral 10. Such comprises a bulk semiconductor substrate having an electrically conductive diffusion region 14 provided therein. Such comprises a node to which electrical connection to a capacitor storage node is to be made. An electrically insulative molding layer 16 is provided outwardly of the upper surface of node 14. Layer 16 preferably comprises a silicon dioxide material, such as borophosphosilicate glass (BPSG) having a boron or phosphorus dopant concentration of from 1% to 10%. Accordingly in the preferred embodiment, molding layer 16 comprises an intrinsically insulative material (i.e., $SiO_2$) having a conductivity enhancing dopant impurity (i.e., phosphorus) provided therein. An initial container contact opening 18 is provided through molding layer 16 to the outer surface of node 14, which for purposes of the continuing discussion comprises an example node location 17.

A first layer 20 of semiconductive material is provided over molding layer 16 and to within initial container contact opening 18 to node location 17 to less than completely fill initial container contact opening 18. Thus, a first remaining container contact opening 22 is formed. An example and preferred semiconductive material is silicon, such as amorphous silicon or polycrystalline silicon. First layer 20 in one embodiment is provided either in situ or after deposition to have an average conductivity enhancing dopant concentration of from 0 $ions/cm^3$ to about $5 \times 10^{19}$ $ions/cm^3$.

Referring to FIG. 2, a second layer 24 of semiconductive material is provided over first layer 20 and to within first remaining container contact opening 22 to less than completely fill first remaining contact opening 22. Thus, a second remaining container contact opening 26 is formed. Second layer 24 of semiconductive material again preferably comprises silicon, such as amorphous or polycrystalline silicon. Second layer 24 is either in situ or after deposition provided to have an average conductivity enhancing dopant concentration of greater than about $5 \times 10^{19}$ $ions/cm^3$. Second layer 24 of semiconductive material is selectively etchable relative to first layer 20 of semiconductive material.

Referring to FIG. 3, a third layer 28 of semiconductive material is provided over second layer 24 and to within second remaining contact opening 26. Again, the preferred base semiconductive material for layer 28 is amorphous or polycrystalline silicon. Such has an average conductivity enhancing dopant concentration like first layer 20 of somewhere from 0 $ions/cm^3$ to about $5 \times 10^{19}$ $ions/cm^3$. Second layer 24 of semiconductive material is selectively etchable relative to third layer 28 of semiconductive material and, as described above, selectively relative to first layer 20. Third layer 30 is provided to a thickness to less than completely fill second remaining container contact opening 26, and thus leave a third remaining contact opening 30.

Referring to FIG. 4, a fourth layer 32 of semiconductive material is provided over third layer 28 and to within third remaining contact opening 30. Again, such preferably comprises amorphous or polycrystalline silicon. Fourth layer 32 is provided to have an average conductivity enhancing dopant concentration of greater than about $5 \times 10^{19}$ $ions/cm^3$, and preferably constitutes the same essential dopant concentration as second layer 24. Fourth layer 32 of semiconductive material is selectively etchable relative to first layer 20 and third layer 28. Fourth layer 32 completely fills third remaining container contact opening 30. Thus, a series of alternating first-type layers 20, 28 and second-type layers 24 and 32 are provided over molding layer 16 within container contact opening 18.

Figure 6:
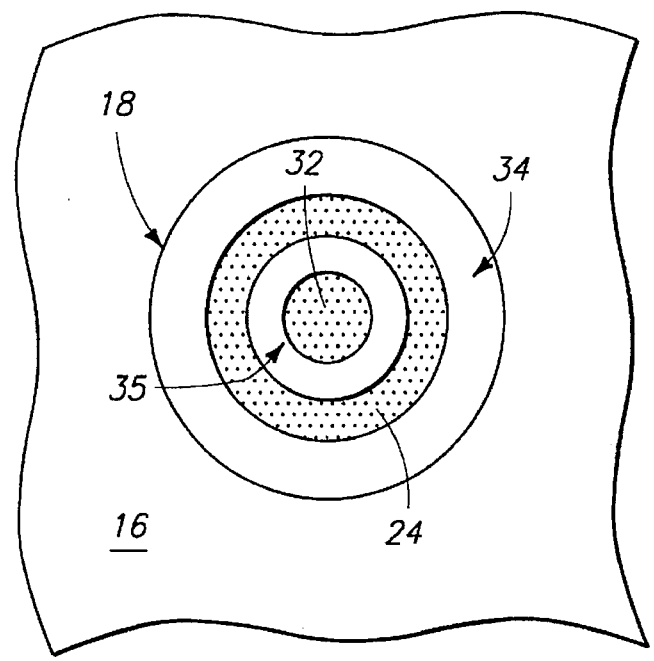
FIG. 6 is a diagrammatic top view of FIG. 5.

Referring to FIGS. 5 and 6, the described first, second, third and fourth layers of semiconductive material are removed from outwardly of capacitor molding layer 16 to define isolated first and second container members 34 and 35, respectively, of first and third layers 20 and 28, respectively, within initial container contact opening 18. Such step is preferably conducted by a chemical-mechanical polishing or other etchback step. First container member 34 and second container member 35 comprise a respective ring portion 36 and a respective base portion 38. Further, second container member 35 defines outer radial edges 40, while first container member 34 defines outer radial edges coincident with initial container contact opening 18.

Figure 7:
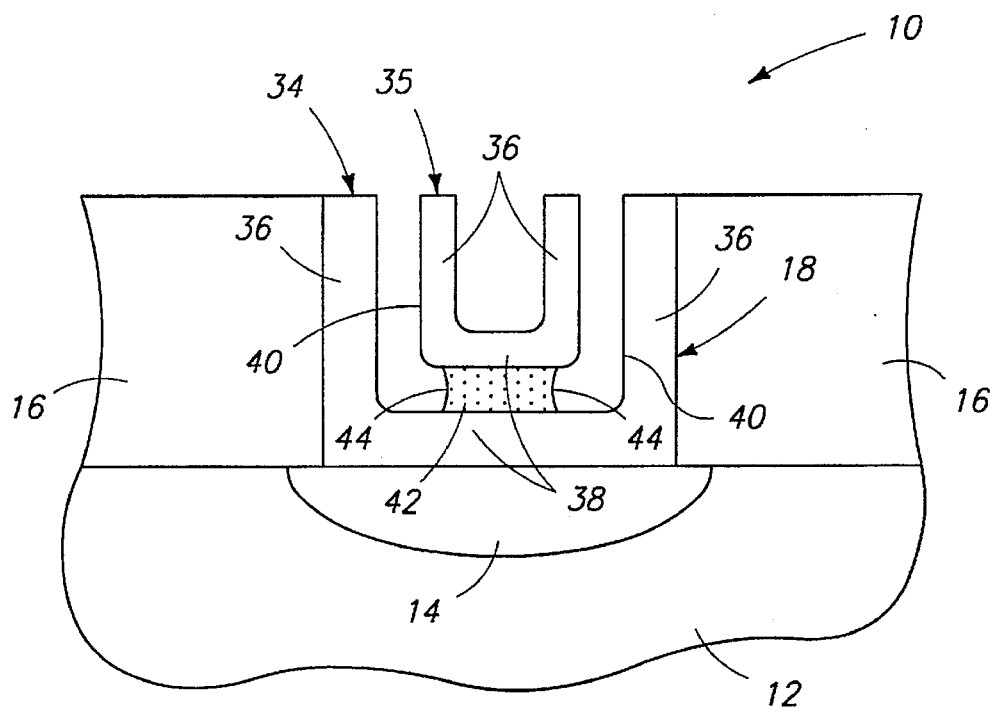
FIG. 7 is a view of the FIG. 1 wafer fragment at a processing step subsequent to that shown by FIGS. 5 and 6.

Referring to FIG. 7, second layer 24 of semiconductive material is selectively etched from between first and second container members 34 and 35, leaving a pedestal disk 42 of second layer material elevationally between first container member 34 and second container member 35. Fourth layer 32 is also selectively etched from remaining portions of container contact opening 18, such as from within second container contact opening 30. An example of a wet etch chemistry for selectively etching heavily doped silicon (i.e., greater than $5 \times 10^{19}$ $ions/cm^3$) relative to lightly doped silicon (i.e., less than $5 \times 10^{19}$ $ions/cm^3$) includes a mixture of 0.7% HF, 50% to 54% $HNO_3$, 2.6% $CH_3COOH$, with the remainder being deionized water (percents are volume percent). The greater the difference between the dopings of the first/third and second/fourth layers, the greater the selectivity. For example, the above chemistry when utilized with a totally undoped first/third layer and a second/fourth layer doping of $2 \times 10^{20}$ $ions/cm^3$ resulted in a selectivity of 120:1. The silicon dopant was phosphorus. Dry etch or vapor etch chemistries can also be used.

Pedestal disk 42 comprises outer radial edges 44 which are received radially inward of second container member 35 outer radial edges 40. In this described preferred embodiment, the selective etching removes all second layer material 24 from between ring portions 36 of first container member 34 and second container member 35.

After the selective etching, first and second container members 34 and 35 are conductively doped to an average dopant concentration of greater than about $5 \times 10^{19}$ $ions/cm^3$ and even more preferably to a concentration greater than or equal to $2 \times 10^{20}$ $ions/cm^3$. Such doping can be accomplished by ion implantation or heat diffusion using an appropriate diffusion gas. Alternately, molding layer 16 can be provided to a sufficiently high phosphorus or other conductivity impurity doping concentration (i.e., from 1%–10%) such that the doping includes out-diffusing conductivity enhancing dopant impurity from molding layer 16 into first container member 34.

Figure 8:
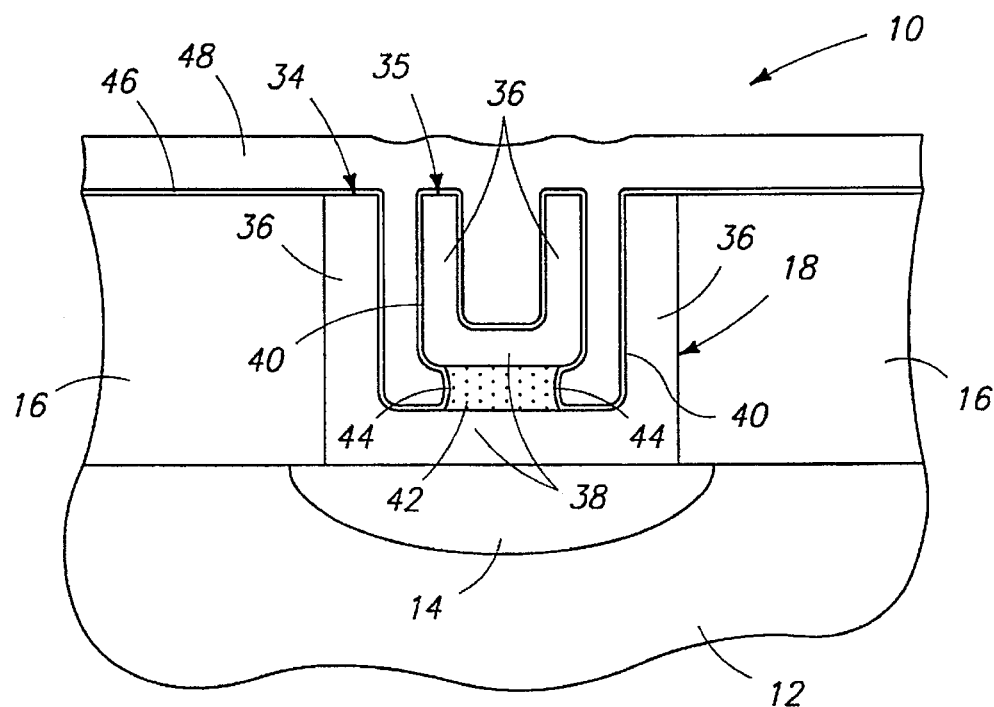
FIG. 8 is a view of the FIG. 1 wafer fragment at a processing step subsequent to that shown by FIG. 7.

Referring to FIG. 8, a capacitor dielectric layer 46 is provided over first container member 34 and second container member 35. An outer capacitor plate layer 48 is subsequently provided over capacitor dielectric layer 46, resulting in a composite capacitor construction. Containers 34 and 35 in combination define a first capacitor plate of such capacitor.

Variations in method and construction to that described above are of course contemplated, with the invention only being limited by the accompanying claims appropriately interpreted in accordance with the doctrine of equivalents. By way of example only and not of limitation, the ordering of the heavily doped and lightly doped layers 20, 24, 28 and 32 can be reversed. An alternate chemistry can be utilized to selectively etch undoped silicon selectively relative to doped silicon. An example chemistry for such purpose is HF 0.53 volume percent, $HNO_3$ at 37.63 volume percent, $CH_3COOH$ at 22.58 volume percent, $NH_4F$ at 4.21 volume percent, with the remaining being deionized water at 35.05 volume percent. Where the lower doped layer is entirely undoped and the heavily doped layer has a dopant concentration of $2 \times 10^{20}$ ions/cm$^3$, a selectivity of greater than 3:1 etching of undoped to doped silicon is obtained.

Further by way of example only, provision of fourth layer 32 might be eliminated. In such event, third layer 28 would preferably be provided as a thicker layer to overcome any tendency of the etch to etch the lower or undoped layer. Such third layer 28 could also be provided to completely fill second remaining contact opening 26, although this would not be most preferred due to minimization of exposed surface area for the capacitor dielectric and second capacitor plate. Further, the FIG. 7 construction might be vacuum annealed or subjected to any of other various process steps to roughen its surface or otherwise increase surface area. Additionally, some or all of molding layer 16 might be removed prior to provision of the capacitor dielectric and second plate layers to provide external capacitance surface area outside of the containers.

Further by way of example only, the alternating layers might constitute different selectively etchable materials other different degree doped semiconductive materials, such as tungsten, titanium, ruthenium and compounds thereof.

Figure 9:
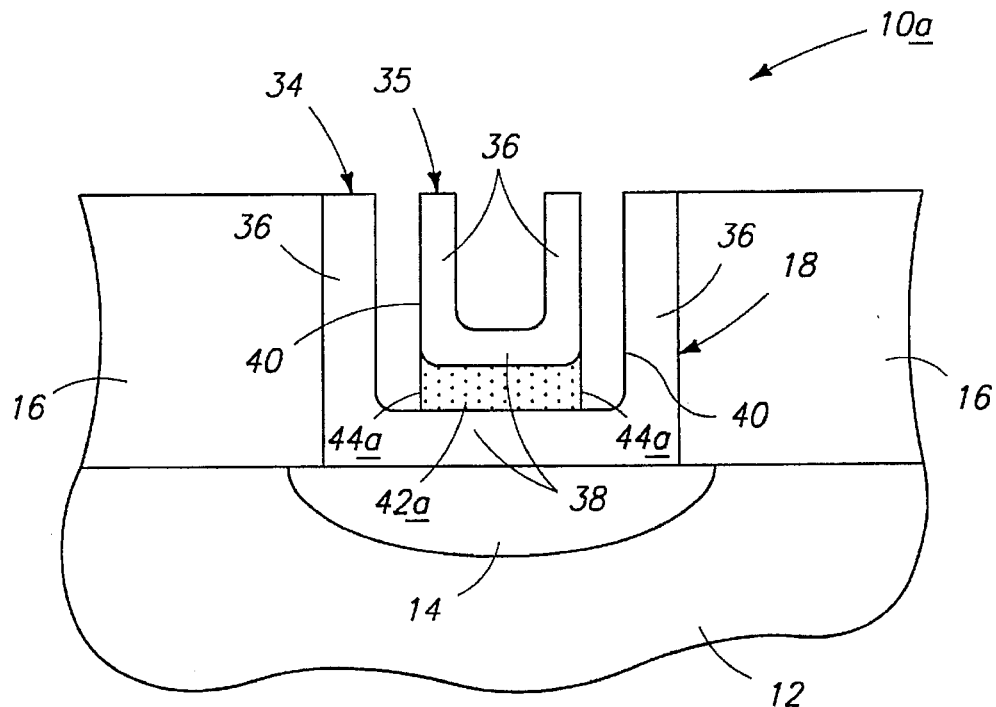
FIG. 9 is a diagrammatic sectional view of an alternate embodiment semiconductor wafer fragment at an alternate processing step of that depicted by FIG. 7.

Yet another possible example construction 10a is shown in FIG. 9. Like numerals from the first described embodiment are utilized where appropriate, with differences being indicated with the suffix "a". Here, pedestal disk 42a has outer edges 44a which are substantially radially coincident with second container member 35 outer radial edges 40.

Figure 10:
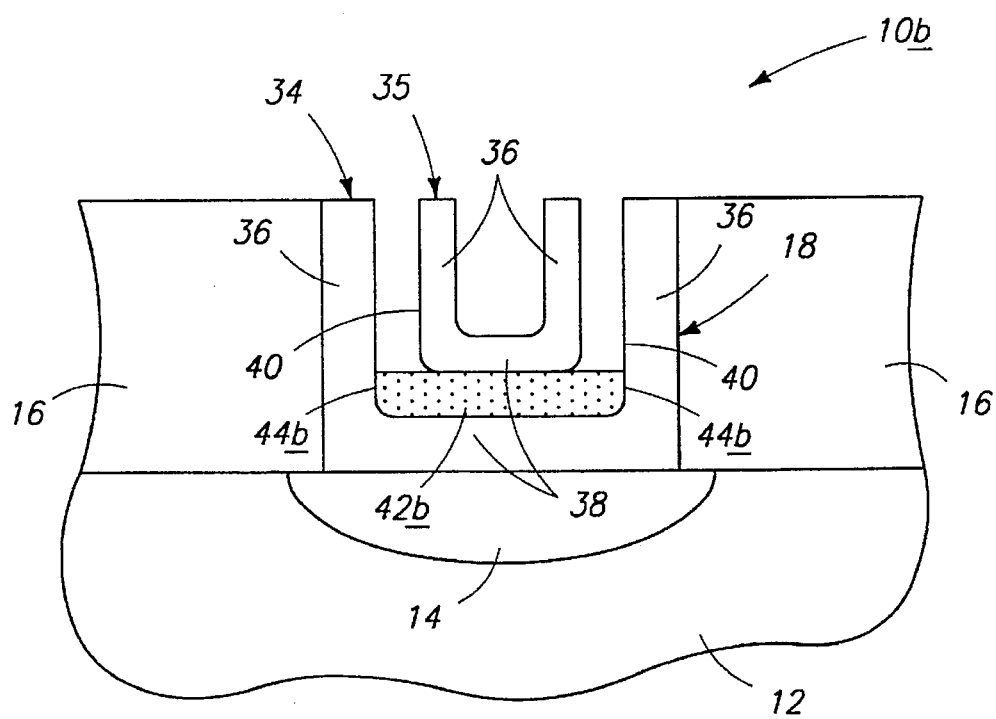
FIG. 10 is a diagrammatic sectional view of an alternate embodiment semiconductor wafer fragment at an alternate processing step of that depicted by FIG. 7.

FIG. 10 illustrates still a further alternate embodiment, with differences being indicated by the suffix "b". Here, pedestal disk 42b effectively extends radially to ring portion 36 of first container member 34, thus positioning pedestal disk outer radial edges radially outward of second container member 35 outer radial edges 40. Yet in both these two example described embodiments, the selective etching has been conducted to remove all second layer material 24 from between ring portions 36 of first and second container members 34 and 35, respectively. Alternately, not all of second layer material 24 might be removed between the ring portions such that a portion thereof extends upwardly therebetween. However, most preferably, etching is conducted to produce the FIG. 7 construction which has the advantage of exposing the greatest amount of surface area within initial container contact opening 18 for the first or storage node plate of a capacitor.

Still yet another alternate embodiment is described with reference to FIGS. 11 and 12. Differences in construction are illustrated with the suffix "c" or with different numerals. Here, fourth deposited layer 32c is deposited to less than completely fill third remaining contact opening 30, thus leaving a fourth remaining contact opening 33. In the context of the first described FIGS. 1–8 embodiment, fourth remaining contact opening 33 is filled or plugged with a fifth layer 37 of semiconductive material of the same conductivity doping as first layer 20 and third layer 28.

Referring to FIG. 12, selective etching is then conducted to etch layers 20, 28 and 27 to leave remaining pedestal disks 42c and 55. Ion implanting or gas diffusion doping could be conducted to conductively dope pedestal disks 42c and 55. Alternately, out diffusion from containers 34c and 35c might provide sufficient conductivity doping. Pedestal 55 would constitute an electrical interconnect between an inner first container 34c and the underlying container storage node. Pedestal disk 42c would constitute an electrical interconnect between first container 34c and second container 35c. Subsequent provision of a capacitor dielectric layer and second capacitor plate layer would advantageously then also overlap over the outer sidewalls of first container member 34c.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a capacitor comprising the following steps:

providing a node location to which electrical connection to a capacitor storage node is to be made;

providing a capacitor molding layer outwardly of the node location;

providing an initial container contact opening through the molding layer to the node location;

providing a first layer of semiconductive material over the molding layer and to within the initial container contact opening to less than completely fill the initial container contact opening and leave a first remaining container contact opening, the first layer of semiconductive material having an average conductivity enhancing dopant concentration from 0 ions/cm$^3$ to about $5 \times 10^{19}$ ions/cm$^3$;

providing a second layer of semiconductive material over the first layer and to within the first remaining container contact opening to less than completely fill the first remaining contact opening and leave a second remaining container contact opening, the second layer of semiconductive material having an average conductivity enhancing dopant concentration of greater than about $5 \times 10^{19}$ ions/cm$^3$, the second layer of semiconductive material being selectively etchable relative to the first layer of semiconductive material;

providing a third layer of semiconductive material over the second layer and to within the second remaining container contact opening, the third layer of semiconductive material having an average conductivity enhancing dopant concentration of from 0 ions/cm$^3$ to about $5 \times 10^{19}$ ions/cm$^3$, the second layer of semiconductive material being selectively etchable relative to the third layer of semiconductive material;

removing the first, second and third layers of semiconductive material from outwardly of the capacitor molding layer to define isolated first and second container members of the first and third layers, respectively, within the initial container contact opening;

selectively etching the second layer of semiconductive material from between the first and second container members, the selective etching leaving a pedestal disk of second layer material elevationally between the first and second container members;

after the selective etching, conductively doping the first and second container members to an average dopant concentration of greater than about $5 \times 10^{19}$ ions/cm$^3$;

providing a capacitor dielectric layer over the first and second container members; and providing an outer capacitor plate over the capacitor dielectric layer.

2. The method of forming a capacitor of claim 1 wherein the third layer of semiconductive material is provided to less than completely fill the second remaining container contact opening.

3. The method of forming a capacitor of claim 1 wherein the third layer of semiconductive material is provided to less than completely fill the second remaining container contact opening and leave a third remaining container contact opening, the method further comprising providing a fourth layer of semiconductive material over the third layer and to within the third remaining container contact opening, the fourth layer of semiconductive material having an average conductivity enhancing dopant concentration of greater than about $5 \times 10^{19}$ ions/cm$^3$, the fourth layer of semiconductive material being selectively etchable relative to the first layer of semiconductive material and the third layer of semiconductive material, the selectively etching step comprising selectively etching the fourth layer from within the initial container contact opening.

4. The method of forming a capacitor of claim 1 wherein all stated semiconductive material comprises the same base semiconductive material.

5. The method of forming a capacitor of claim 1 wherein the molding layer comprises an intrinsically insulative material having a conductivity enhancing dopant impurity provided therein, the conductively doping step comprising diffusing conductivity enhancing dopant impurity from the molding layer into the first container member.

6. The method of forming a capacitor of claim 1 wherein the second container member has outer radial edges and the pedestal disk has outer radial edges, the pedestal disk outer radial edges being received radially inward of the second container member outer radial edges.

7. The method of forming a capacitor of claim 1 wherein the first and second container members comprise a respective ring portion and a respective base portion, the selective etching being conducted to remove all second layer material from between the ring portions of the first and second container members.

8. The method of forming a capacitor of claim 1 wherein,
all stated semiconductive material comprises the same base semiconductive material; and
the third layer of semiconductive material is provided to less than completely fill the second remaining container contact opening.

9. The method of forming a capacitor of claim 1 wherein,
all stated semiconductive material comprises the same base semiconductive material; and
the third layer of semiconductive material is provided to less than completely fill the second remaining container contact opening and leave a third remaining container contact opening, the method further comprising providing a fourth layer of semiconductive material over the third layer and to within the third remaining container contact opening, the fourth layer of semiconductive material having an average conductivity enhancing dopant concentration of greater than about $5 \times 10^{19}$ ions/cm$^3$, the fourth layer of semiconductive material being selectively etchable relative to the first layer of semiconductive material and the third layer of semiconductive material, the selectively etching step comprising selectively etching the fourth layer from within the initial container contact opening.

10. The method of forming a capacitor of claim 1 wherein,
all stated semiconductive material comprises the same base semiconductive material; and
the molding layer comprises an intrinsically insulative material having a conductivity enhancing dopant impurity provided therein, the conductively doping step comprising diffusing conductivity enhancing dopant impurity from the molding layer into the first container member.

11. A method of forming a capacitor comprising the following steps:

providing a node location to which electrical connection to a capacitor storage node is to be made;

providing a capacitor molding layer outwardly of the node location;

providing an initial container contact opening through the molding layer to the node location;

providing a first layer of semiconductive material over the molding layer and to within the initial container contact opening to less than completely fill the initial container contact opening and leave a first remaining container contact opening, the first layer of semiconductive material having an average conductivity enhancing dopant concentration of greater than about $5 \times 10^{19}$ ions/cm$^3$;

providing a second layer of semiconductive material over the first layer and to within the first remaining container contact opening to less than completely fill the first remaining contact opening and leave a second remaining container contact opening, the second layer of semiconductive material having an average conductivity enhancing dopant concentration of from 0 ions/cm$^3$ to about $5 \times 10^{19}$ ions/cm$^3$, the second layer of semiconductive material being selectively etchable relative to the first layer of semiconductive material;

providing a third layer of semiconductive material over the second layer and to within the second remaining container contact opening, the third layer of semiconductive material having an average conductivity enhancing dopant concentration of greater than about $5 \times 10^{19}$ ions/cm$^3$, the second layer of semiconductive material being selectively etchable relative to the third layer of semiconductive material;

removing the first, second and third layers of semiconductive material from outwardly of the capacitor molding layer to define isolated first and second container members of the first and third layers, respectively, within the initial container contact opening;

selectively etching the second layer of semiconductive material from between the first and second container members, the selective etching leaving a pedestal disk of second layer material elevationally between the first and second container members;

providing a capacitor dielectric layer over the first and second container members; and providing an outer capacitor plate over the capacitor dielectric layer.

12. The method of forming a capacitor of claim 11 wherein the third layer of semiconductive material is provided to less than completely fill the second remaining container contact opening.

13. The method of forming a capacitor of claim 11 wherein the third layer of semiconductive material is provided to less than completely fill the second remaining container contact opening and leave a third remaining container contact opening, the method further comprising providing a fourth layer of semiconductive material over the third layer and to within the third remaining container contact opening, the fourth layer of semiconductive material having an average conductivity enhancing dopant concentration of from 0 ions/cm$^3$ to about 5×10$^{19}$ ions/cm$^3$, the fourth layer of semiconductive material being selectively etchable relative to the first layer of semiconductive material and the third layer of semiconductive material, the selectively etching step comprising selectively etching the fourth layer from within the initial container contact opening.

14. The method of forming a capacitor of claim 11 wherein all stated semiconductive material comprises the same base semiconductive material.

15. The method of forming a capacitor of claim 11 wherein the molding layer comprises an intrinsically insulative material having a conductivity enhancing dopant impurity provided therein, the conductively doping step comprising diffusing conductivity enhancing dopant impurity from the molding layer into the first container member.

16. The method of forming a capacitor of claim 11 wherein the second container member has outer radial edges and the pedestal disk has outer radial edges, the pedestal disk outer radial edges being received radially inward of the second container member outer radial edges.

17. The method of forming a capacitor of claim 11 wherein the first and second container members comprise a respective ring portion and a respective base portion, the selective etching being conducted to remove all second layer material from between the ring portions of the first and second container members.

18. The method of forming a capacitor of claim 11 wherein,
all stated semiconductive material comprises the same base semiconductive material; and
the third layer of semiconductive material is provided to less than completely fill the second remaining container contact opening.

19. The method of forming a capacitor of claim 11 wherein,
all stated semiconductive material comprises the same base semiconductive material; and
the third layer of semiconductive material is provided to less than completely fill the second remaining container contact opening and leave a third remaining container contact opening, the method further comprising providing a fourth layer of semiconductive material over the third layer and to within the third remaining container contact opening, the fourth layer of semiconductive material having an average conductivity enhancing dopant concentration of greater than about 5×10$^{19}$ ions/cm$^3$, the fourth layer of semiconductive material being selectively etchable relative to the first layer of semiconductive material and the third layer of semiconductive material, the selectively etching step comprising selectively etching the fourth layer from within the initial container contact opening.

20. The method of forming a capacitor of claim 11 wherein,
all stated semiconductive material comprises the same base semiconductive material; and
the molding layer comprises an intrinsically insulative material having a conductivity enhancing dopant impurity provided therein, the conductively doping step comprising diffusing conductivity enhancing dopant impurity from the molding layer into the first container member.

21. A method of forming a capacitor comprising the following steps:
providing a node location to which electrical connection to a capacitor storage node is to be made;
providing a capacitor molding layer outwardly of the node location;
providing a container contact opening through the molding layer to the node location;
providing a series of alternating first and second layers of semiconductive material over the molding layer within the container contact opening, one of the first and second layers having an average conductivity enhancing dopant concentration of greater than about 5×10$^{19}$ ions/cm$^3$, the other of the first and second layers having an average conductivity enhancing dopant concentration from 0 ions/cm$^3$ to about 5×10$^{19}$ ions/cm$^3$, at least one of the first and second layers being selectively etchable relative to the other of the first and second layers;
removing the alternating first and second layers of semiconductive material from outwardly of the capacitor molding layer to define isolated first and second container members of the other of the first and second layers within the container contact opening;
selectively etching the one of the first and second layers of semiconductive material from between the first and second container members, the selective etching leaving a pedestal disk of the one of the first and second layers of semiconductive material elevationally between the first and second container members;
providing a capacitor dielectric layer over the first and second container members; and
providing an outer capacitor plate over the capacitor dielectric layer.

22. The method of forming a capacitor of claim 21 wherein the second container member has outer radial edges and the pedestal disk has outer radial edges, the pedestal disk outer radial edges being received radially inward of the second container member outer radial edges.

23. The method of forming a capacitor of claim 21 wherein the first and second container members comprise a respective ring portion and a respective base portion, the selective etching being conducted to remove all second layer material from between the ring portions of the first and second container members.

24. The method of forming a capacitor of claim 21 wherein the semiconductive material of the first and second layers comprises the same base semiconductive material.

25. The method of forming a capacitor of claim 21 wherein the selectively etching step also provides a pedestal disk elevationally between the node location and the first container member.

26. A method of forming a capacitor comprising the following steps:
providing a node location to which electrical connection to a capacitor storage node is to be made;
providing a capacitor molding layer outwardly of the node location;
providing a container contact opening through the molding layer to the node location;

providing a series of alternating first and second layers of material over the molding layer within the container contact opening, at least one of the first and second layers being selectively etchable relative to the other of the first and second layers;

removing the alternating first and second layers of material from outwardly of the capacitor molding layer to define isolated first and second container members of the other of the first and second layers within the container contact opening;

selectively etching the one of the first and second layers of material from between the first and second container members, the selective etching leaving a pedestal disk of the one of the first and second layers of material elevationally between the first and second container members;

providing a capacitor dielectric layer contacting the first and second container members; and providing an outer capacitor plate over the capacitor dielectric layer.

27. The method of forming a capacitor of claim 26 wherein the second container member has outer radial edges and the pedestal disk has outer radial edges, the pedestal disk outer radial edges being received radially inward of the second container member outer radial edges.

28. The method of forming a capacitor of claim 26 wherein the first and second container members comprise a respective ring portion and a respective base portion, the selective etching being conducted to remove all second layer material from between the ring portions of the first and second container members.

29. The method of forming a capacitor of claim 26 wherein the selectively etching step also provides a pedestal disk elevationally between the node location and the first container member.

* * * * *

UNITED STATES PATENT AND TRADEMARK OFFICE
CERTIFICATE OF CORRECTION

PATENT NO. : 5,661,064
DATED : August 26, 1997
INVENTOR(S) : Thomas Figura et al.

It is certified that error appears in the above-identified patent and that said Letters Patent is hereby corrected as shown below:

Column 3, line 67: Replace "$5 \times 10^{19}$ *ions/cm3*," with -- $5 \times 10^{19}$ ions/cm$^3$, --

Signed and Sealed this

Nineteenth Day of May, 1998

Attest:

BRUCE LEHMAN

Attesting Officer     Commissioner of Patents and Trademarks